(12) United States Patent
Raic

(10) Patent No.: US 10,687,433 B1
(45) Date of Patent: Jun. 16, 2020

(54) ELECTRICAL COMPONENT ENCLOSURE ASSEMBLY AND METHOD OF USE

(71) Applicant: Phoenix Contact Development and Manufacturing, Inc., Middletown, PA (US)

(72) Inventor: Dejan Raic, Harrisburg, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 16/439,346

(22) Filed: Jun. 12, 2019

(51) Int. Cl.
*H05K 7/14* (2006.01)
*H05K 5/00* (2006.01)
*H01R 9/26* (2006.01)
*E05C 3/14* (2006.01)
*H05K 5/02* (2006.01)

(52) U.S. Cl.
CPC ............ *H05K 7/1417* (2013.01); *E05C 3/14* (2013.01); *H01R 9/2608* (2013.01); *H05K 5/0004* (2013.01); *H05K 5/0221* (2013.01)

(58) Field of Classification Search
CPC .. H05K 7/1417; H05K 5/0221; H05K 5/0004; E05C 3/14; H01R 9/2608
See application file for complete search history.

(56) References Cited

U.S. PATENT DOCUMENTS

| | | |
|---|---|---|
| 4,956,747 A | 9/1990 | Beer et al. |
| 5,318,461 A | 6/1994 | Frikkee et al. |
| 5,602,363 A | 2/1997 | Von Arx |
| 6,215,204 B1 | 4/2001 | Brown et al. |
| 6,431,909 B1 | 9/2002 | Nolden et al. |
| 6,456,495 B1 | 9/2002 | Wieloch et al. |
| 6,570,769 B1 | 5/2003 | Royer et al. |
| 6,686,672 B2 | 2/2004 | Brown et al. |
| 7,011,551 B2 | 3/2006 | Johansen et al. |
| 7,190,589 B2 | 3/2007 | Caines et al. |
| 7,287,996 B1 | 10/2007 | Shing |
| D563,903 S | 3/2008 | Radau et al. |
| D566,049 S | 4/2008 | Radau et al. |
| 7,369,413 B2 | 5/2008 | Caines et al. |
| 7,413,479 B1 | 8/2008 | Volpone |
| 7,483,278 B2 | 1/2009 | Otto et al. |
| D588,552 S | 3/2009 | Radau et al. |
| 7,553,180 B2 | 6/2009 | Hu et al. |
| 7,606,039 B2 | 10/2009 | Trinh |
| 7,695,324 B2 | 4/2010 | Diekmann |
| 7,704,102 B2 | 4/2010 | Nad |
| 7,933,126 B2 | 4/2011 | Jain |
| D693,776 S * | 11/2013 | Skowranek ............... D13/162 |
| 8,582,311 B2 | 11/2013 | Van Giesen et al. |
| 8,602,809 B2 | 12/2013 | Kyoyama |
| 8,897,020 B2 | 11/2014 | Kang et al. |
| 8,902,598 B2 | 12/2014 | Chin et al. |

(Continued)

FOREIGN PATENT DOCUMENTS

EP 909122 4/1999

OTHER PUBLICATIONS

Phoenix Contact, Electronics Housings Product Overview 2019/2010, Catalog, 2018, 112 pages.

*Primary Examiner* — Abhishek M Rathod
(74) *Attorney, Agent, or Firm* — Hooker & Habib, P.C.

(57) ABSTRACT

An enclosure assembly for housing printed circuit boards and related electrical components having a secured lid that may be removed by-hand.

20 Claims, 8 Drawing Sheets

(56) References Cited

U.S. PATENT DOCUMENTS

| | | | |
|---|---|---|---|
| 8,968,016 B1 | 3/2015 | Wu | |
| 8,986,033 B2 * | 3/2015 | Berger | H05K 7/1468 |
| | | | 439/341 |
| 9,263,861 B2 | 2/2016 | Schumacher et al. | |
| 9,363,918 B2 | 6/2016 | Santoni et al. | |
| 9,401,733 B2 | 7/2016 | Wu | |
| 9,454,140 B2 | 9/2016 | Godau et al. | |
| 9,601,850 B2 * | 3/2017 | Best | H05K 7/1469 |
| D786,796 S * | 5/2017 | Frye | D13/133 |
| 9,936,598 B2 | 4/2018 | Gruber | |
| 9,967,993 B1 * | 5/2018 | Walker | H05K 5/0221 |
| D827,575 S | 9/2018 | Oyster | |
| D833,392 S * | 11/2018 | Frye | D13/133 |
| 10,149,397 B2 | 12/2018 | Ichikizaki et al. | |
| 10,411,373 B1 * | 9/2019 | Roecker | H01R 12/515 |
| 2002/0072256 A1 * | 6/2002 | Lostoski | H01R 9/26 |
| | | | 439/76.1 |
| 2010/0285690 A1 * | 11/2010 | Molnar | H01R 9/2608 |
| | | | 439/532 |
| 2015/0362964 A1 * | 12/2015 | Correll | H05K 7/1477 |
| | | | 361/679.4 |
| 2017/0238433 A1 | 8/2017 | Jiang | |
| 2017/0367208 A1 * | 12/2017 | Mielnik | H05K 7/1474 |
| 2018/0020564 A1 * | 1/2018 | Kang | H01R 9/2608 |
| 2018/0092235 A1 * | 3/2018 | Mielnik | H01R 12/7058 |
| 2018/0115107 A1 * | 4/2018 | Correll | H01R 13/62977 |
| 2018/0183176 A1 | 6/2018 | Liao | |
| 2019/0094067 A1 * | 3/2019 | Oh | G01J 1/0271 |
| 2019/0123521 A1 * | 4/2019 | Merz | H02B 1/0523 |
| 2019/0269026 A1 * | 8/2019 | Aubert | H05K 7/14 |

* cited by examiner

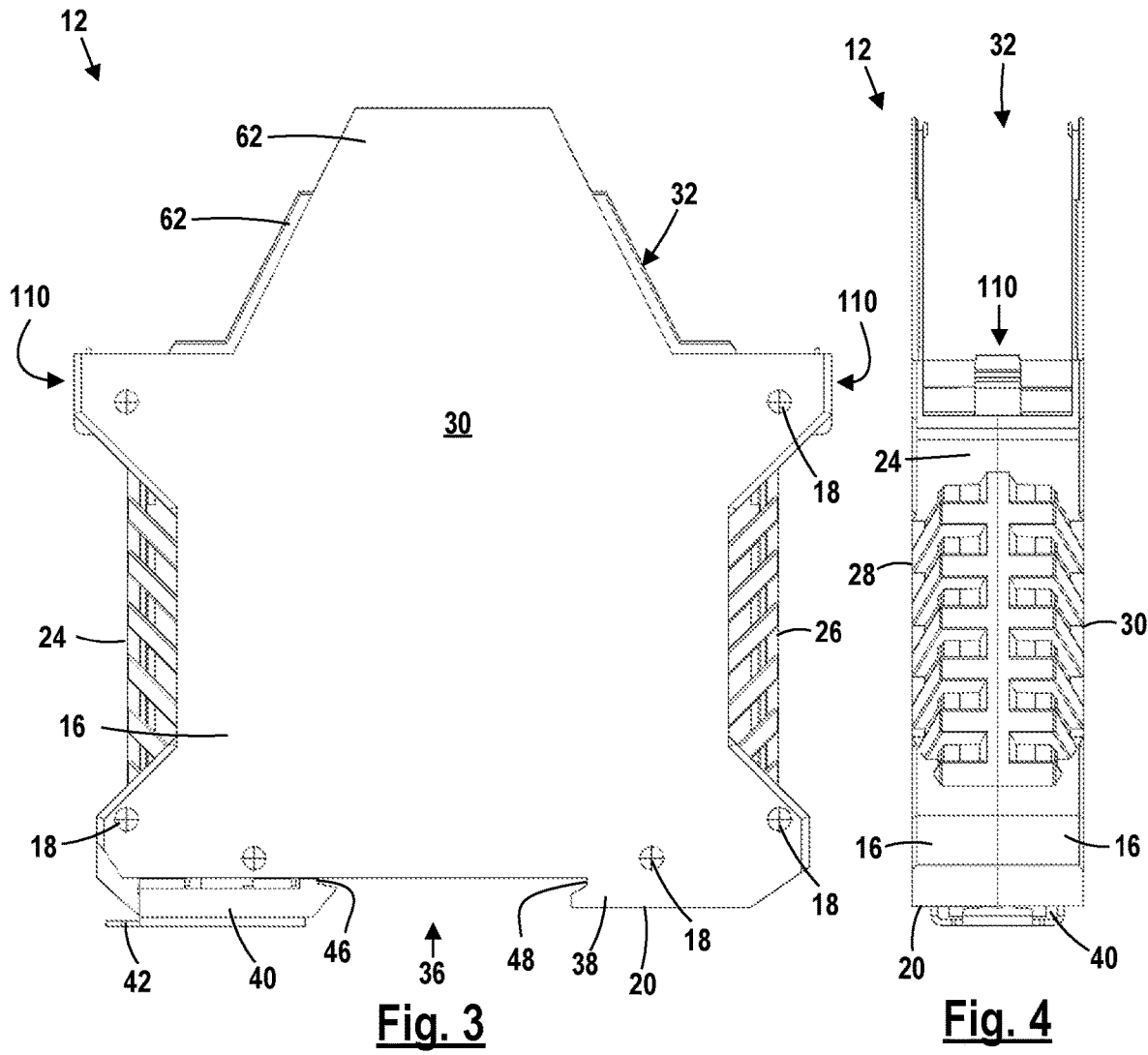
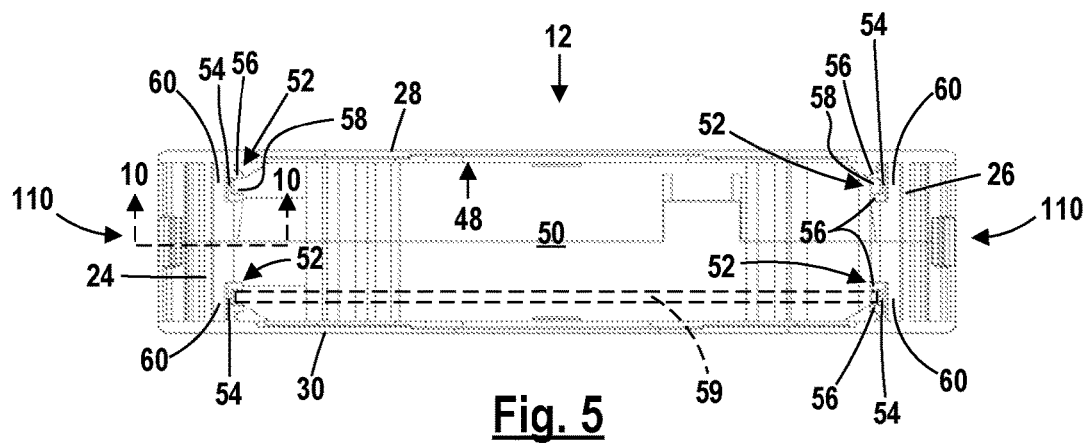

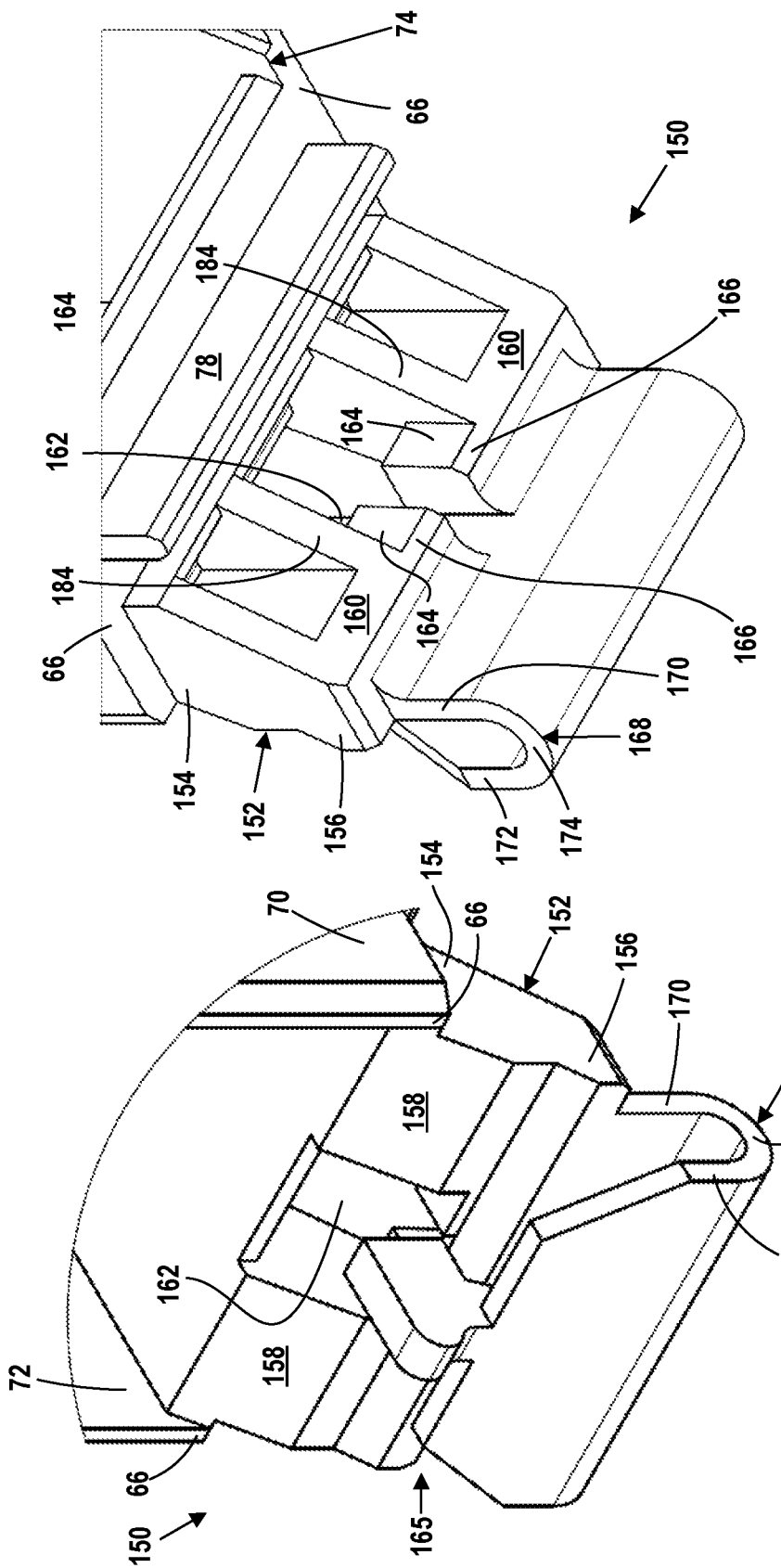

1

ELECTRICAL COMPONENT ENCLOSURE ASSEMBLY AND METHOD OF USE

FIELD OF THE DISCLOSURE

The disclosure relates to enclosures for electrical components and in particular to latches for securing lids to electrical component enclosures.

BACKGROUND OF THE DISCLOSURE

Enclosures for housing electrical components such as circuit boards (PCBs), electronic modules and like electrical components are known. Enclosures are typically made of plastic or metal and are designed to house electrical components within a secured recess. The enclosures are adapted for installation on DIN rails or the like for use in industrial control equipment applications.

In prior art enclosures it is known for electrical component enclosures to have removable lids. Lids are secured in place to an enclosure by use of retention latches having small latch components that are cannot be actuated by hand.

In order to actuate the small latch components to disengage retention latches and remove a lid from an enclosure, a tool having a fine, flat blade, such as a screwdriver blade, must be used. The tool blade is pressed against the latch components to actuate retention latches and allow lid removal.

The requirement to use a blade tool to actuate electrical component enclosure latch assemblies complicates enclosure use and access. Properly locating a tool blade to actuate small latch components is time-consuming. As enclosures commonly include more than one latch, a tool blade must be manipulated multiple times to achieve lid removal.

Thus, it is desirable to provide an electrical component enclosure assembly that allows for improved latch actuation. The assembly should allow user actuation by hand without the use of specialized tools to overcome the challenges mentioned above.

BRIEF SUMMARY OF THE DISCLOSURE

Disclosed is an electrical component enclosure assembly that provides improved latch actuation by hand without the use of specialized tools.

The disclosed assembly includes actuation elements that allow the actuation of small latch components without the use of an outside tool. The disclosed assembly allows user removal of an enclosure lid by hand, simplifying lid removal. Additionally, the disclosed assembly provides the user with physical feedback which informs the user of proper latch actuation during lid removal.

Other objects and features will become apparent as the description proceeds, especially when taken in conjunction with the accompanying drawing sheets.

BRIEF DESCRIPTION OF THE DRAWINGS

FIG. 3 is a front view of the assembly base;

FIG. 4 is a side view of the assembly base;

FIG. 5 is a top view of the assembly base;

FIG. 11 is a detailed perspective view of the assembly lid;

FIG. 12 is an alternate detailed perspective view of the assembly lid;

DETAILED DESCRIPTION

Figures 1, 2:
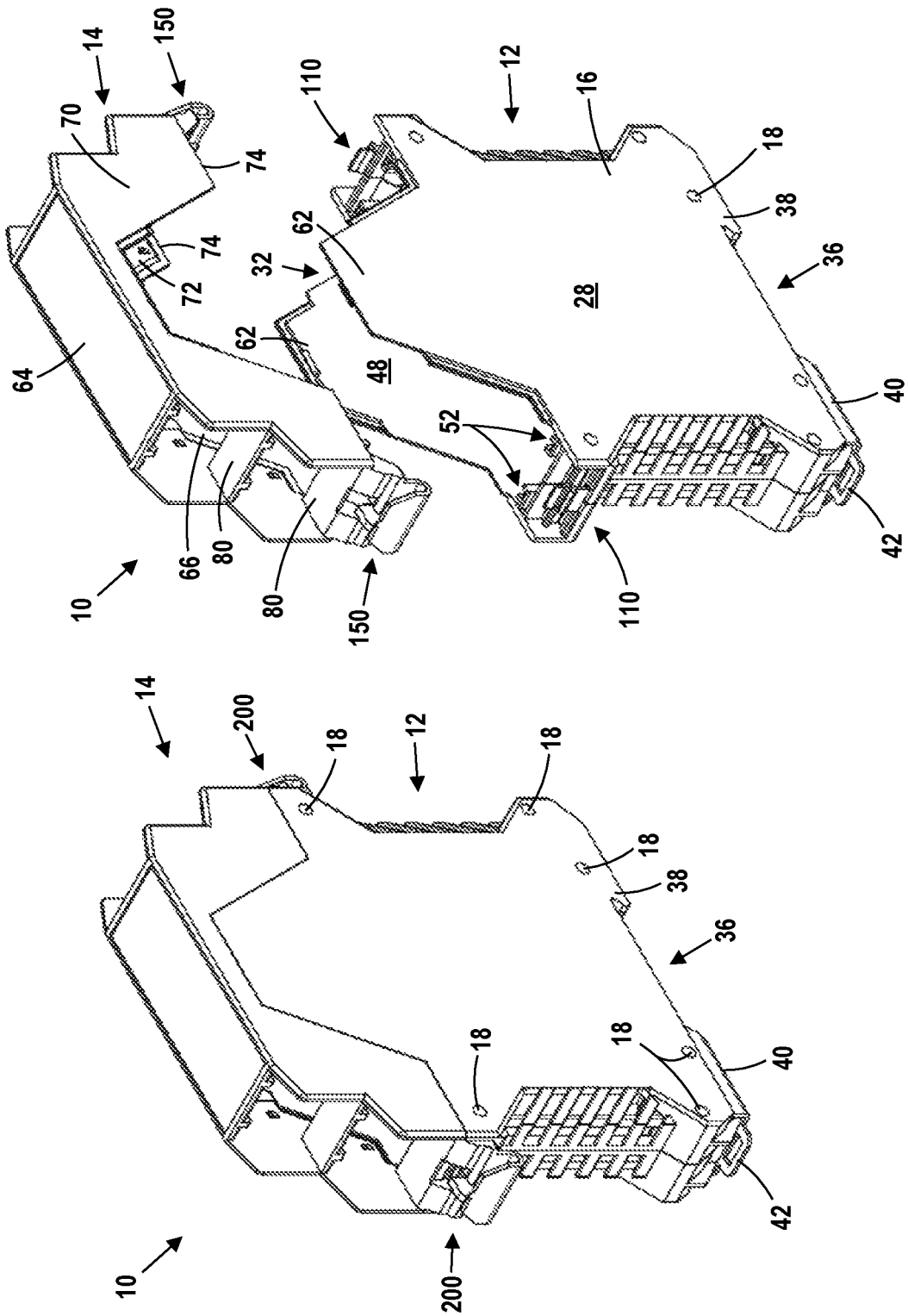
FIG. 1 is a perspective view of an electrical component enclosure assembly having an assembly base with installed assembly lid and including the disclosed latch assembly.
FIG. 2 is an exploded view of the electrical assembly base and assembly lid.
Figures 6, 7:
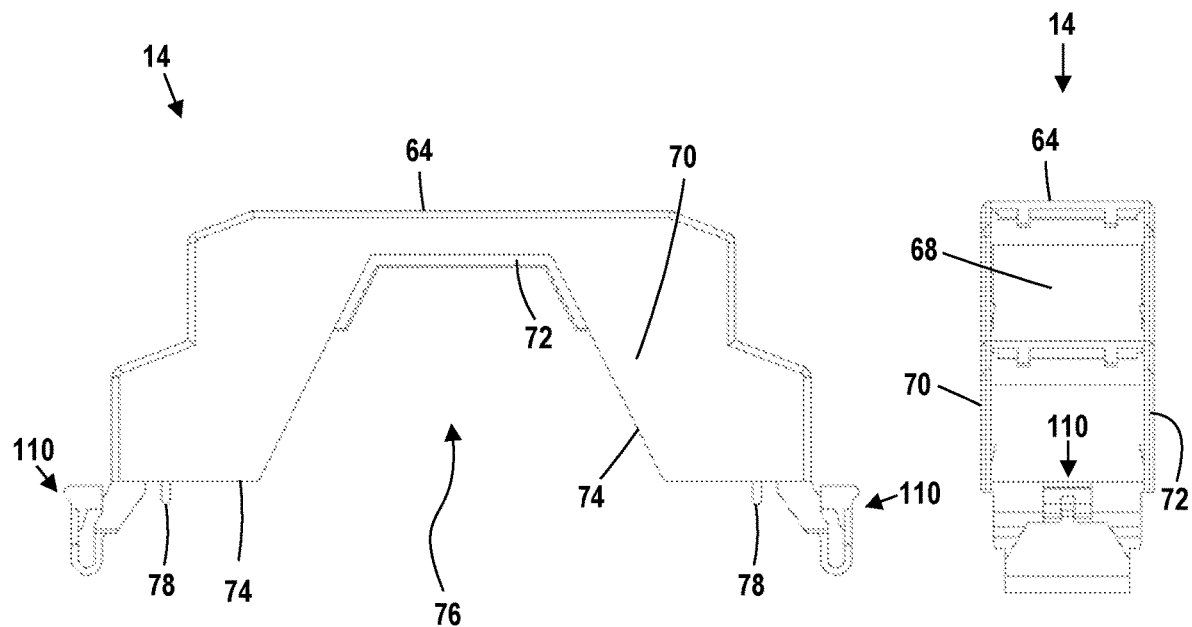
FIG. 6 is a front view of the assembly lid.
FIG. 7 is a side view of the assembly lid.
Figure 8:
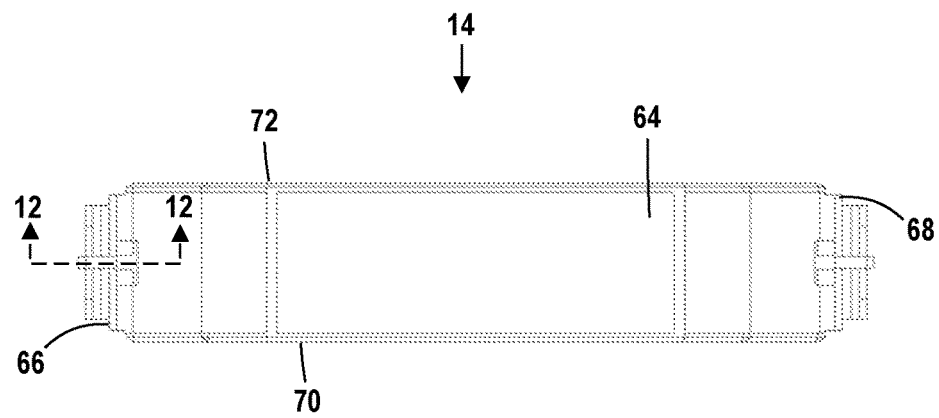
FIG. 8 is a bottom view of the assembly lid.
Figure 10:
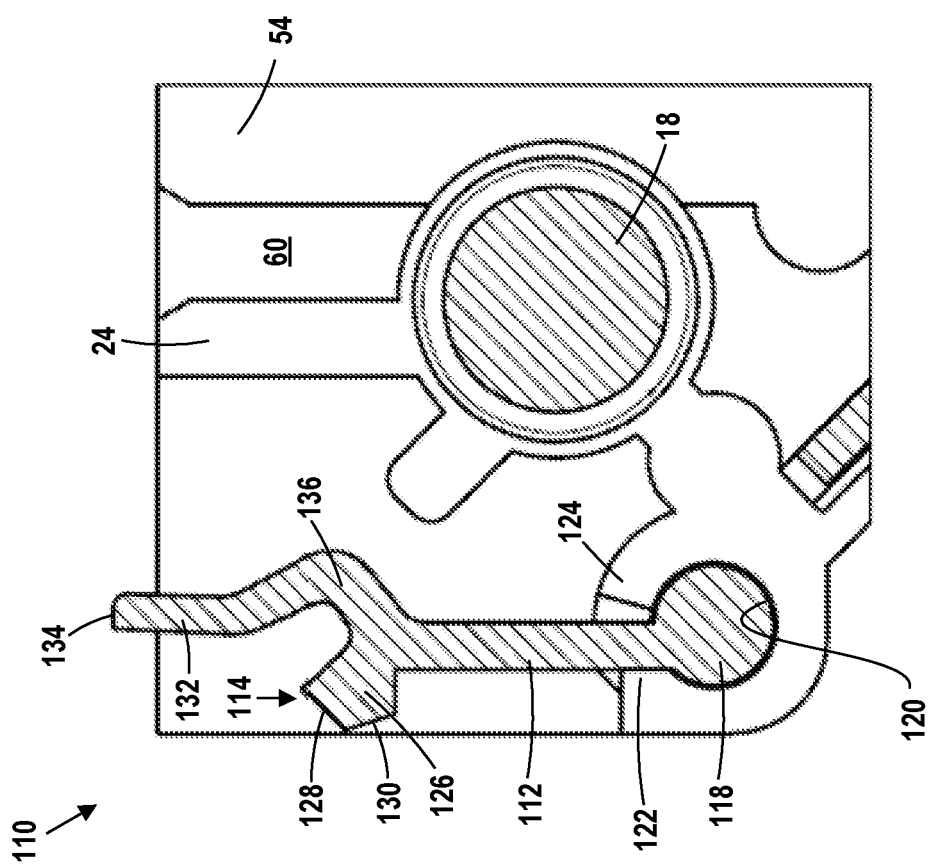
FIG. 10 is a sectional view taken along line 10--10 of FIG. 5.

FIG. 1 shows an electrical component enclosure assembly 10 having an assembly base 12 and an assembly lid 14. As shown in the figures, assembly base 12 is generally rectangular in shape. Assembly base 12 and assembly lid 14 may be molded from plastic.

In embodiments, base 12 may be formed from two like molded plastic shells 16 joined together by a number of fasteners 18 extending between the shells. In embodiments, lid 14 may be molded from a single piece of plastic.

Assembly base 12 is made up of five base walls: bottom wall 20, side walls 24, 26, and front and rear walls 28, 30. Assembly base mouth 32 is located at the top of base 12, extends about the upward edges of walls 24-30 and opens into enclosure internal cavity 34. The surrounding body walls define cavity 34 which is generally rectangular.

The exterior of assembly base 12 proximate bottom wall 20 may include a DIN rail engagement member 36 for mounting enclosure 10 to a DIN rail. Member 36 may be a clamp 36 having a first rigid jaw 38 joined to base 12 and a second sliding jaw 40. Jaw 40 is joined to tab 42, which allows jaw 40 to be moved back and forth along the bottom of base 12. Jaws 38 and 40 have opposed rail engagement surfaces 44, 46. Surfaces 44, 46 face each other to facilitate engagement member 36 installation to DIN rail elements.

At installation to a DIN rail, adjustable jaw 40 is pulled away from jaw 38 by tab 42 to facilitate placement of DIN rail beams proximate clamp engagement surfaces 44, 46. Adjustable jaw 40 is then moved to fully engage DIN rail beams and secure installation of enclosure 10 to a DIN rail.

The interior cavity 34 of base 12 has an cavity interior surface 48 defined by the inner surfaces of walls 24-30 and a cavity bottom surface 50 defined by the inner surface of bottom wall 20. Cavity 34 may include one or more opposed pairs of circuit board retention members 52. As shown in the figures, a circuit board retention member 52 is located proximate front or rear wall 28, 30 of base 12 and extends generally from the bottom of the base proximate bottom wall 20 to base mouth 32. Each circuit board retention member 52 is made up of a member wall 54 extending away from a front or rear wall 28, 30 and into cavity 34 and a pair of member clamps 56. Member wall 54 and clamps 56 define an elongate slot 58 that extends generally from the bottom of the base proximate bottom wall 20 to base mouth 32. A pair of circuit board retention members 52 is adapted for mounting electrical components within cavity 34. A mounted electrical component may be a circuit board 59 held between a pair of opposed members 52 within slots 58 as shown in FIG. 5.

Slots 58 may be sized to provide an appropriate interference fit for a circuit board 59 having a certain thickness. The interference-fit between circuit board 59 and slots 58 is sufficient to secure board 59 against undesired movement in base 12. In specific embodiments slots 58 may be sized to provide an appropriate interference fit for circuit boards having thickness ranging from approximately 0.093 inches to 0.062 inches approximately.

The side walls 24, 26 of assembly base 12 may include a pair of locating slots 60 proximate base mouth 32. As shown in the figures, each slot 60 may be defined by a side wall 24, 26, a front or rear wall 28, 30 and a slot wall 54 so that slots 60 are continuous with internal cavity 34.

As shown in the figures, base 12 front and rear walls 28, 30 may include like upwardly extending ridges 62.

Enclosure lid 14 is made up of top wall 64, side walls 66, 68, and front and rear walls 70, 72. Enclosure lid edge 74 extends about the downward side of lid 14 and walls 66-72.

Lid edge 74 is adapted to complement enclosure base mouth 32 and may include valleys 76 in front and rear walls 70, 72. Lid valleys 76 fit into base ridges 62 to assure proper location of lid 14 onto base 12 at enclosure closing.

Side walls 66, 68 of assembly lid 14 may include locating ridges 78 proximate lid edge 74. Ridges 78 are generally rectangular and adapted to fit within complementary locating slots 60 on assembly base 12 when lid 14 is fitted onto base 12.

Each side of assembly lid 14 may include one or more cross-struts 80 extending between front and rear walls 70, 72 and proximate side walls 66, 68.

Side walls 24, 26 of base 12 have retention latch assemblies 110. Assemblies 110 are located on side walls 24, 26 proximate assembly base mouth 32.

Figure 9:
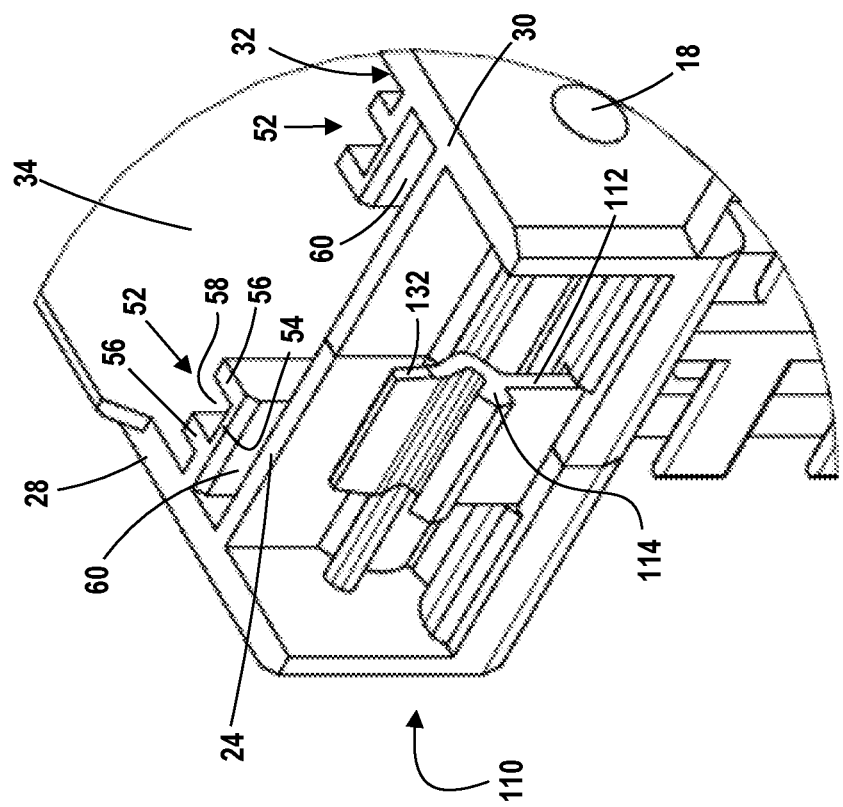
FIG. 9 is a detailed perspective view of the assembly base.

Each retention latch assembly 110 includes a latch arm 112, a latch hook 114, and latch engagement beam 132. Latch arm 112 may have a uniform thickness extending generally between base 12 front and rear walls 28, 30, as shown in FIG. 9.

Latch arm 112 extends from axle 118 to latch hook 114. Axle 118 is housed within a bearing cavity 120 located proximate base side walls 24 and 26. Axle 118 rotates within bearing cavity 120 with radial movement of arm 112. Bearing cavity 120 allows latch arm 112 to move radially about 20 degrees between bearing cavity end walls 122, 124.

Latch hook 114 includes latch head 126 having upper and lower caroming surfaces 128, 130.

Latch engagement beam 132 extends from latch hook 114 to latch end surface 134. Latch engagement beam 132 is joined to latch hook 114 by latch arm spring 136, which allows deflection of beam 132 as explained below.

Lid 14 may include a pair of latch engagement assemblies 150. As shown in the figures, first and second latch engagement assemblies 150 are located at the side portions 66, 68 of lid 14 proximate lid edge 74.

A latch engagement assembly 150 is joined to a lid side portion 66, 68 by support strut 152.

Figure 13:
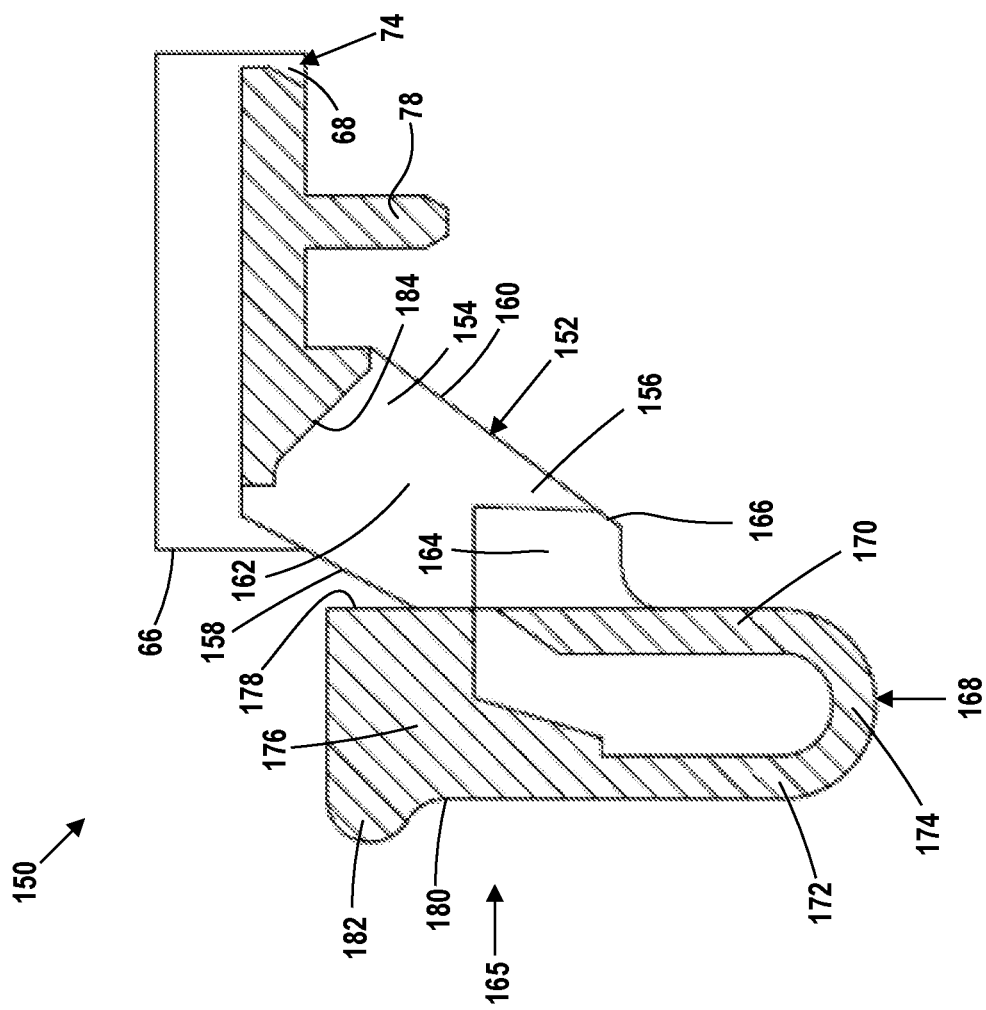
FIG. 13 is a sectional view taken along line 13--13 of FIG. 8.

Strut 152 extends from lid side portions 66, 68 proximate lid edge 74 and away therefrom as shown in FIGS. 11-13.

Strut 152 extends from an inner strut end 154 to an outer strut end 156 and includes strut outer surface 158 and strut inner surface 160. Strut outer surface 158 faces generally away from lid edge 74 and lid front and rear walls 70, 72. Strut inner surface 160 faces generally toward lid edge 74 and lid front and rear walls 70, 72.

A strut aperture 162 extends through strut 152. Latch retention blocks 164 are located on strut 152 proximate inward surface 160 and strut aperture 162. Retention blocks 164 include caroming surfaces 166 proximate inward surface 160.

Lid 14 may also include a pair latch actuation assemblies 165. As shown in the figures, first and second latch actuation assemblies 165 are located proximate engagement assemblies 150 at the side portions 66, 68 of lid 14.

Each latch actuation assembly 165 is jointed to outer strut end 156 and includes a U-shaped spring 168. Spring 168 includes a par of spring beams 170, 172 joined at spring bend 174. Spring 168 is mounted to outer strut end 156.

Disengagement head 176 is mounted to the free end of spring beam 172. Disengagement head 176 has an inner contact surface 178 and an outer surface 180. Outer surface 180 includes a ridge 182. Ridge 182 provides tactile feedback and grip assistance for a user during assembly use.

Disengagement head 176 is located proximate strut aperture 162 and is adapted to pass through aperture 162 during use of latch actuation assembly 165 as explained below.

Latch actuation assembly 165 also includes lid caroming surface 184 located on strut inner surface 160 proximate strut inner strut end 154.

Retention latch assembly 110, latch engagement assembly 150 and latch actuation assembly 165 co-operate to form lid retention assembly 200. As shown in the figures, a pair of lid retention assemblies 200 may be located on opposed sides of enclosure 10 to secure lid 14 to body 12.

Use of electrical component enclosure 10 will now be explained.

FIGS. 14-17 show the installation process of assembly lid 14 onto assembly base 12.

Figure 14:
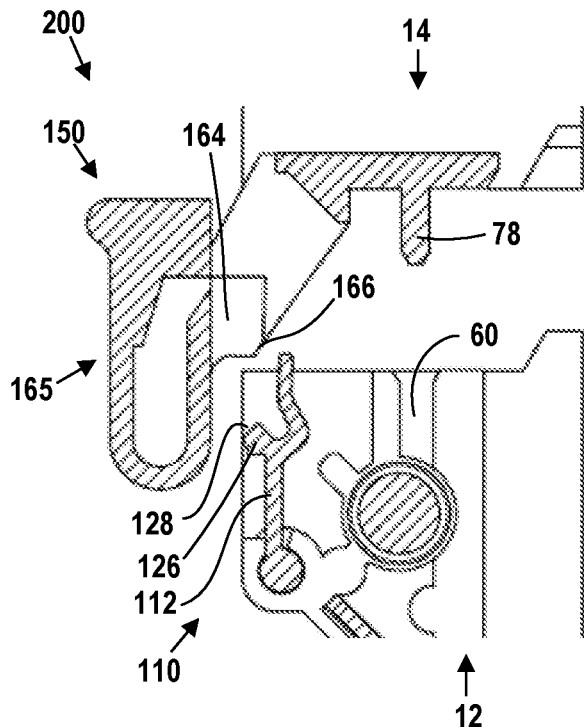
FIGS. 14-17 are sectional views showing latching of the assembly lid to the assembly base.

FIG. 14 shows lid 14 over base 12 before lid installation.

Figure 15:
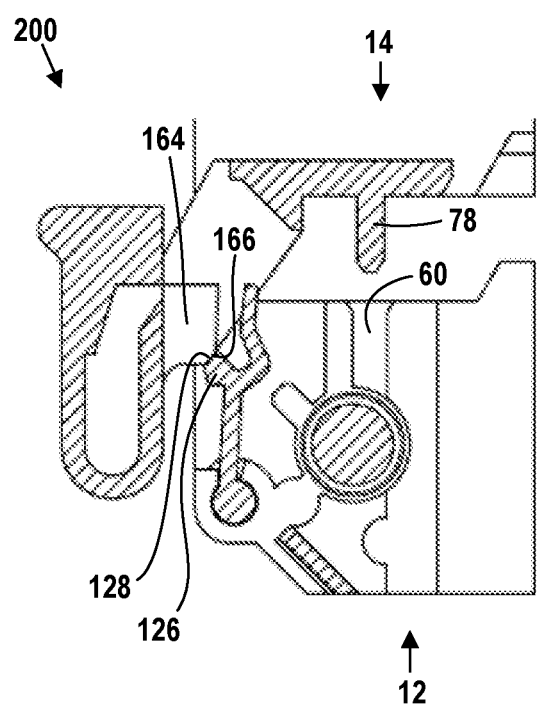

FIG. 15 shows the beginning of the installation process. At this stage of the process, latch retention blocks 164 are brought into contact with latch arm 112. At this stage, the upper camming surface 128 of latch head 126 makes contact with latch hook 114 at the camming surfaces 166 of retention blocks 164. Contact between camming surfaces 128, 166 allows the transmission of force from retention blocks 164 to latch head 126 and latch arm 112 as discussed immediately below.

Figure 16:
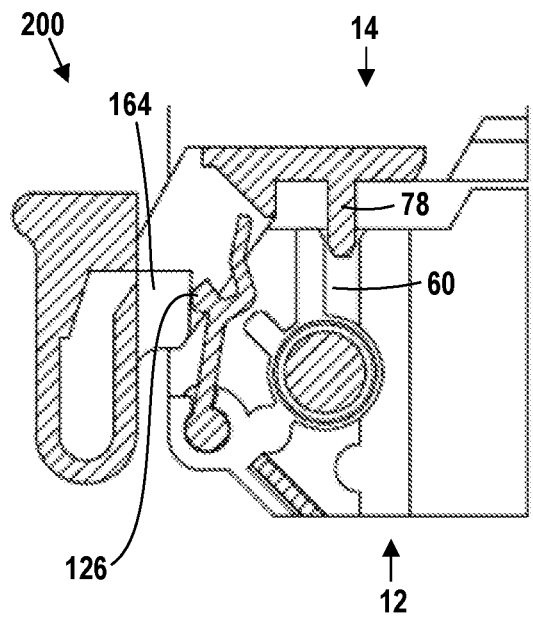

FIG. 16 shows a midpoint in the installation process as lid 14 is brought into further contact with base 12. At this stage of the process, the force transmitted by retention blocks 164 to latch head 126 causes latch arm 112 to rotate about axle 118 within bearing cavity 120. This allows inward radial movement of arm 112. Bearing cavity 120 allows latch arm 112 to move radially clockwise about 20 degrees to locate latch head 126 inwardly of retention blocks 164. Also at this stage of the process, ridge 78 is placed in proximity to locating slot 60.

As the installation process continues and lid 14 is brought into further contact with base 12, latch end surface 134 of latch engagement beam 132 makes contact with lid camming surface 184. As lid 14 is brought closer to and into further contact with base 12, this transmits a force from lid camming surface 184 to latch engagement beam 132 to cause latch arm 112 to rotate radially counterclockwise about axle 118 within bearing cavity 120. This allows outward radial movement of arm 112 so that latch hook 114 engages retention blocks 164 as discussed immediately below.

Figure 17:
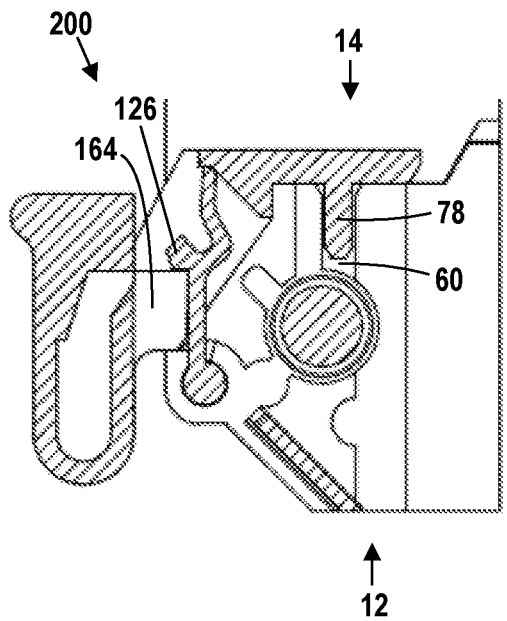

FIG. 17 shows completion of the installation process with lid 14 fully installed onto base 12 so that lid edge 74 is brought into full contact with base mouth 32. At this stage of the process, latch hook 114 of arm 112 fully engages retention blocks 164 to secure lid 14 onto base 12. Also, at this stage of the process, ridge 78 is located fully within locating slot 60.

Figure 18:
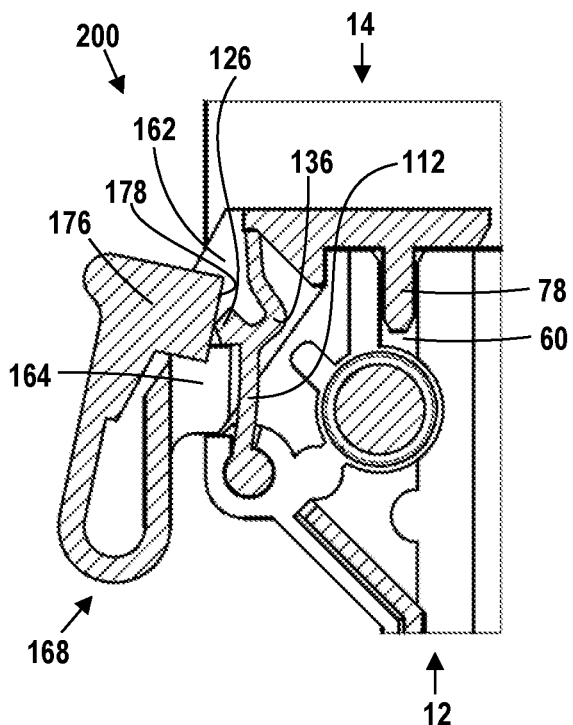
FIGS. 18-20 are sectional views showing unlatching of the assembly lid from the assembly base.
Figure 19:
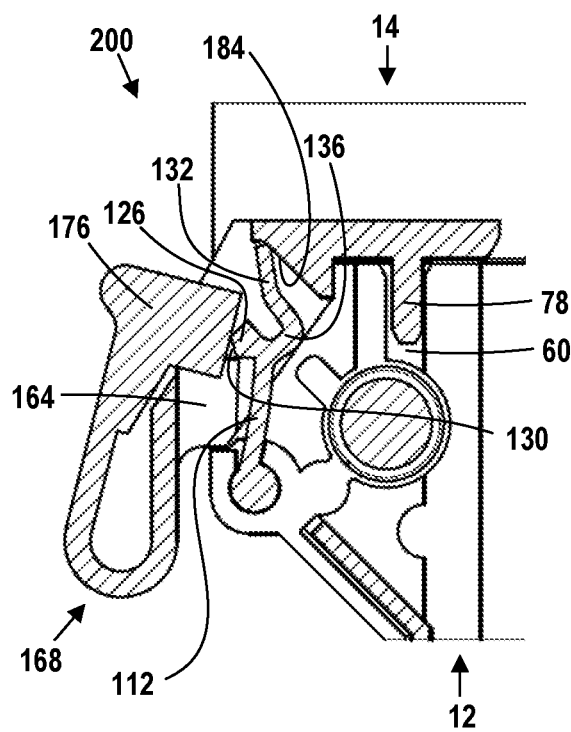
Figure 20:
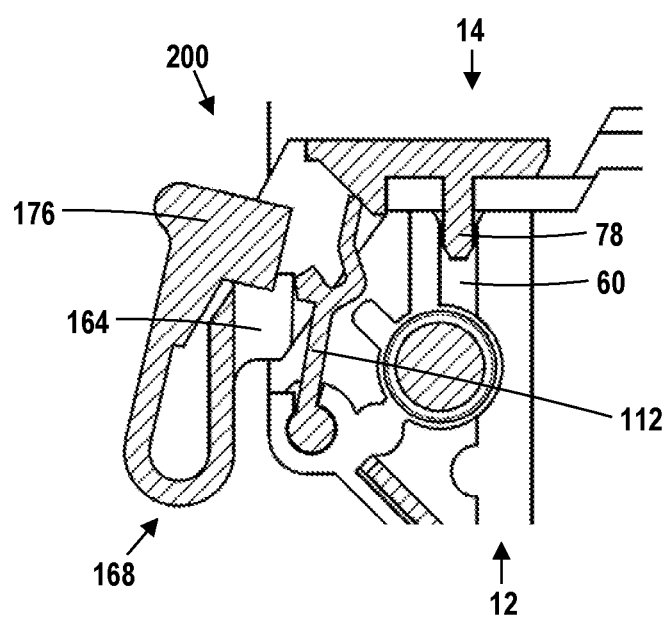

FIGS. 18-20 show removal of assembly lid 14 from assembly base 12.

In order to remove assembly lid 14 from assembly base 12, latch hook 114 of arm 112 must be disengaged from retention blocks 164.

FIG. 18 shows the beginning of the lid removal and latch hook disengagement process. At this stage, a user places a force onto disengagement head 176. This force compresses spring 168 so that head 176 is moved toward and into strut aperture 162, and head inner contact surface 178 makes contact with latch head 126.

FIG. 19 shows a midpoint in the lid removal and latch hook disengagement process. At this stage of the process, additional inward force from disengagement head 176 is transmitted to latch arm 112 and latch engagement beam 132 so that arm spring 136 is compressed. As compression of arm spring 136 continues, latch engagement beam 132 is pressed against lid camming surface 184 so that beam 132 is turned in a counterclockwise direction. The compression of arm spring 136 and corresponding motion of latch engagement beam 132 allows camming surface 130 of latch head 126 to move inwardly and over retention blocks 164 as discussed immediately below.

As the lid removal and latch hook disengagement process continues, further inward force is applied to disengagement head 176 and transmitted to latch head 126. When sufficient force is applied, latch head camming surface 130 is located inwardly and over retention blocks 164. Disengagement head 176 is then released by a user. Upon this release, disengagement head 176 is biased outwardly by spring 168 to its original, uncompressed state. As contact between disengagement head 176 and latch head 126 ceases, latch arm spring 136 biases latch engagement beam 132 against lid camming surface 184 so that beam 132 is moved inwardly in a clockwise direction to simultaneously exert a disengagement force against lid 14 to move lid 14 upward and away from base 12 as well as to move latch head camming surface 130 inwardly of retention blocks 164 to disengage latch hook 114 from retention blocks 164.

This simultaneous action effectively disengages lid 14 from base 12 in a single step. The action of lid 14 being forced away from base 12 provides a user with physical feedback that confirms that the latch has properly disengaged from retention blocks 164 for lid removal.

FIG. 20 shows lid 14 removed from base 12 before full release of spring 168 and disengagement head 176 to their original, uncompressed states.

While the present disclosure illustrates an electrical component enclosure 10 having a pair of lid retention assemblies 200 located on opposed sides of the enclosure to secure a lid 14 to a base 12, alternate embodiments are contemplated. Alternate embodiments may include an electrical component enclosure having a single lid retention assembly 200 to secure a lid 14 to a base 12 as well as an electrical component enclosure having more than two lid retention assemblies 200 to secure a lid 14 to a base 12.

Also, while the present disclosure illustrates a lid retention assembly 200 made up of a retention latch assembly 110 joined to assembly base 12 and a latch engagement assembly 150 and latch actuation assembly 165 joined to assembly lid 14, alternate embodiments are contemplated. Alternate embodiments may include a lid retention assembly 200 made up of a retention latch assembly 110 joined to an assembly lid 14 and a latch engagement assembly 150 and latch actuation assembly 165 joined to assembly base 12. Further alternate embodiments may include a lid retention assembly 200 wherein the latch actuation assembly 165 is located on assembly lid 14 and latch engagement assembly 150 is located on assembly base 12. Yet further alternate embodiments may include a lid retention assembly 200 wherein the latch actuation assembly 165 is located on assembly base 12 and latch engagement assembly 150 is located on assembly lid 14.

While this disclosure discloses and describes various embodiments, it is understood that this is capable of modification and that the disclosure is not limited to the precise details set forth, but includes such changes and alterations as fall within the purview of the following claims.

I claim:

1. An enclosure assembly for an electrical component, said enclosure assembly comprising:
   an assembly base comprising opposed front and rear base walls, opposed first and second side base walls and a bottom base wall, said base walls defining a base cavity extending from a base cavity bottom surface proximate said bottom base wall to a base cavity mouth proximate a top of the base away from said bottom base wall, said base cavity comprising one or more circuit board retention members, said bottom base wall comprising a DIN rail engagement member, a base wall comprising a retention latch assembly proximate said base cavity mouth, said retention latch assembly comprising a bearing cavity, a latch arm extending from a latch arm axle mounted in said bearing cavity to a latch hook, said arm comprising a latch engagement beam joined to said latch arm by a latch arm spring;
   an assembly lid comprising opposed front and rear lid walls, opposed first and second side lid walls and a top lid wall, said front, rear and side lid walls comprising a lid edge away from said top lid wall, a lid wall comprising a latch engagement assembly proximate said lid edge and a latch actuation assembly proximate said lid edge, said latch engagement assembly comprising a latch retention block, said latch actuation assembly comprising a disengagement head, said disengagement head biased away from said lid edge;
   said retention latch assembly, said latch engagement assembly and said latch actuation assembly comprising a lid retention assembly on a side of said enclosure assembly wherein said enclosure assembly has an open configuration wherein said lid is removed from said base and a closed configuration wherein said lid is on said base so that said lid edge is proximate said base cavity mouth and said latch hook engages said latch retention block wherein said disengagement head is adapted to actuate and disengage said latch hook from said latch retention block wherein said DIN rail engagement member is adapted for engaging a DIN rail and wherein said each circuit board retention member is adapted for retaining a circuit board.

2. The assembly of claim 1 wherein said latch actuation assembly comprises a spring element biasing said disengagement head away from said lid edge.

3. The assembly of claim 2 wherein said spring element is a U-shaped spring comprising first and second spring beams and a spring bend said first spring beam jointed to said lid proximate said lid edge.

4. The assembly of claim 3 comprising a pair of circuit board retention members, each circuit board retention member comprising an elongate retention member slot, said retention member slots facing each other.

5. The assembly of claim 4 said base comprising a locating slot proximate said base mouth and said lid comprising a locating ridge proximate lid edge and wherein in said closed configuration said locating ridge is in said locating slot.

6. The assembly of claim 5 comprising a second lid retention assembly on an opposed enclosure assembly side.

7. The assembly of claim 6 wherein said DIN rail engagement member comprises a first and second rail engagement surfaces, said first and second rail engagement surfaces facing each other.

8. The assembly of claim 6 wherein said base cavity is rectangular in shape.

9. An electrical component enclosure assembly comprising an assembly base, an assembly lid and a lid retention assembly, the assembly base having a base cavity extending from a base cavity mouth proximate a top of the base to a bottom base wall proximate a bottom base, the base cavity comprising circuit board retention means adapted for retaining a circuit board, said bottom base wall comprising DIN rail engagement means adapted for engaging a DIN rail, the assembly lid having a lid edge, said lid retention assembly comprising a retention latch assembly, a latch engagement assembly and a latch actuation assembly, said retention latch assembly proximate said base cavity mouth and comprising a latch arm and a latch engagement beam joined to said latch arm, said latch engagement assembly and a latch actuation assembly proximate said lid edge, said latch engagement assembly comprising a latch retention block, said latch actuation assembly comprising a disengagement head, said disengagement head biased away from said lid edge, wherein said enclosure assembly has an open configuration wherein said lid is removed from said base and a closed configuration wherein said lid is on said base so that said lid edge is proximate said base cavity mouth and said latch hook engages said latch retention block.

10. The electrical component enclosure assembly of claim 9 wherein said circuit board retention means comprises one or more circuit board retention members, each circuit board retention member comprising a retention member slot.

11. The electrical component enclosure assembly of claim 10 comprising two circuit board retention members, each circuit board retention member slot facing an opposed circuit board retention member slot.

12. The electrical component enclosure assembly of claim 9 wherein said DIN rail engagement means comprises a clamp, said clamp comprising a rigid jaw and a sliding jaw wherein said sliding jaw is adapted to move relative to said rigid jaw.

13. The electrical component enclosure assembly of claim 9 wherein said a latch engagement beam is joined to said latch arm by a latch arm spring.

14. The electrical component enclosure assembly of claim 13, said latch arm comprising a latch arm axle, said latch arm axle mounted in a bearing cavity in said assembly base.

15. The electrical component enclosure assembly of claim 9 comprising a second lid retention assembly proximate said base cavity mouth and said lid edge.

16. The electrical component enclosure assembly of claim 9 wherein said latch actuation assembly comprises a spring element biasing said disengagement head away from said lid edge.

17. An electrical component enclosure assembly comprising:
an assembly base having a base cavity extending from a base cavity mouth proximate a top of the base to a bottom base wall proximate a bottom base, opposed front and rear base walls and opposed side base wall extending from the bottom base wall to the top of the base, said base cavity comprising circuit board retention member adapted for retaining a circuit board, said bottom base wall comprising a clamp adapted for engaging a DIN rail;
an assembly lid having opposed front and rear lid walls and opposed side lid walls extending from a lid top wall to a lid edge proximate a bottom of the lid;
at least one of said assembly base and assembly lid comprising a retention latch assembly, said retention latch assembly comprising a latch arm and a latch engagement beam joined to said latch arm;
at least one of said assembly base and assembly lid comprising a latch engagement assembly, said latch engagement assembly comprising a latch retention block;
at least one of said assembly base and assembly lid comprising a comprising a latch actuation assembly, said latch actuation assembly comprising a disengagement head joined to at least one of said assembly base and assembly lid, said disengagement head biased away from said latch arm and latch retention block, said retention latch assembly, latch engagement assembly and latch actuation assembly comprising a lid retention assembly, wherein said enclosure assembly has an open configuration wherein said lid is removed from said base and a closed configuration wherein said lid is on said base so that said lid edge is proximate said base cavity mouth and said latch hook engages said latch retention block.

18. The assembly of claim 17 comprising a second lid retention assembly on an opposed side of the electrical component enclosure assembly.

19. The electrical component enclosure assembly of claim 17 wherein each said latch actuation assembly comprises a spring element biasing said disengagement head away from said latch arm and latch retention block.

20. The electrical component enclosure assembly of claim 19 said latch arm comprising a latch arm axle, said latch arm axle mounted in a bearing cavity in said assembly base.

* * * * *